United States Patent [19]
Moore

[11] Patent Number: 5,801,552
[45] Date of Patent: Sep. 1, 1998

[54] VOLTAGE DETECTOR CIRCUIT

[75] Inventor: David Moore, Carp, Canada

[73] Assignee: Motorola, Inc., Schaumburg, Ill.

[21] Appl. No.: 841,705

[22] Filed: Apr. 30, 1997

[30] Foreign Application Priority Data

May 30, 1996 [GB] United Kingdom ............ 9611283

[51] Int. Cl.$^6$ .................................................. G11C 7/06
[52] U.S. Cl. ........................................ 327/62; 327/58
[58] Field of Search .................................. 327/62, 58, 59, 327/60, 91, 94, 96

[56] References Cited

U.S. PATENT DOCUMENTS

| | | |
|---|---|---|
| 4,219,152 | 8/1980 | Couch et al. ............ 327/58 |
| 4,375,037 | 2/1983 | Ikushima ................. 307/268 |
| 4,631,737 | 12/1986 | Davis et al. ............. 327/58 |
| 5,003,196 | 3/1991 | Kawaguchi .............. 327/60 |
| 5,159,340 | 10/1992 | Smith ..................... 327/58 |

*Primary Examiner*—Toan Tran
*Attorney, Agent, or Firm*—Sharon K. Coleman

[57] ABSTRACT

A voltage detector circuit (10) for detecting voltage levels of a digital data bitstream has an input terminal (20) coupled to receive the digital data bitstream. A first peak detector circuit (40) coupled to the input terminal detects a positive peak voltage, and provides a first peak signal. A first differential amplifier is coupled to the input terminal and further coupled to receive the first peak signal, for providing a first difference signal. A second peak detector circuit is coupled to receive the first difference signal from the first differential amplifier, for detecting a peak voltage in the first difference signal and for providing a second peak signal. The first peak signal indicates the value of logical 1 levels in the bitstream, and the second peak signal indicates the relative value of logical 0 levels in the bitstream with respect to the logical 1 levels.

7 Claims, 1 Drawing Sheet

VOLTAGE DETECTOR CIRCUIT

FIELD OF THE INVENTION

This invention relates to voltage detector circuits and particularly though not exclusively to voltage detector circuits

BACKGROUND OF THE INVENTION

Amplitude modulated data in a bitstream, such as is present at the demodulated output of a radio receiver, is typically interpreted by a data comparator, which distinguishes between logical 1 and logical 0 values in the bitstream.

The exact voltages corresponding to the logical 1 and logical 0 values are not known accurately in advance, and in any case will vary substantially with modulation depth and other factors. The data comparator needs to have a reference voltage halfway between the logical 1 and logical 0 voltage values, such that voltages above this reference voltage will be interpreted as logical 1 values, and voltages below this level will be interpreted as logical 0 values.

A conventional approach is to use a Resistor-Capacitor (RC) integrator network to determine an average voltage level of the bitstream and to use this average voltage level as the reference voltage for the comparator. Portions of the bitstream above this level are then interpreted as logical 1 values, and portions below this level are interpreted as logical 0 values.

A problem with this arrangement is that in order to minimise waveform 'sag' and thus improve noise immunity, the time constant of the RC integrator network must be made much longer than the typical period associated with the data frequency. This results in a long settling time for the reference voltage.

A further problem is that when the data contains long strings of logical 1 or logical 0 values, the average level departs appreciably from the true mid-point level. This results in poor noise immunity, poor sensitivity and/or lengthy response times, which in turn can lead to excessive radio power consumption.

This invention seeks to provide a voltage detector circuit which mitigates the above mentioned disadvantages.

SUMMARY OF THE INVENTION

According to the present invention there is provided a voltage detector circuit for detecting voltage levels of a digital data bitstream, the detector circuit comprising: an input terminal coupled to receive the digital data bitstream; a first peak detector circuit coupled to the input terminal, for detecting a positive peak voltage thereat, and for providing a first peak signal; a first differential amplifier coupled to the input terminal and further coupled to receive the first peak signal, for providing a first difference signal; and, a second peak detector circuit coupled to receive the first difference signal from the first differential amplifier, for detecting a peak voltage in the first difference signal and for providing a second peak signal, wherein the first peak signal indicates the value of logical 1 levels in the bitstream, and the second peak signal indicates the relative value of logical 0 levels in the bitstream with respect to the logical 1 levels.

The voltage detector circuit preferably further comprises a second differential amplifier coupled to receive the first and second peak signals, for providing a value indicative of the voltage level at a mid-point between the logical 1 and logical 0 levels. Preferably a voltage bias signal is used to bias the first differential amplifier.

The first peak signal is preferably used to bias the second differential amplifier. Preferably the second differential amplifier comprises a non-inverting input coupled to receive the voltage bias signal, and an inverting input coupled to receive the second peak signal.

The second differential amplifier preferably has a gain of substantially 0.5. The first differential amplifier preferably has a gain of substantially 1.

In this way a voltage level is provided which does not depart appreciably from the mid-point of the logical 0 and logical 1 levels, even when the data contains long strings of logical 1 or logical 0 values. Thus noise immunity is improved and radio power consumption is made more efficient.

BRIEF DESCRIPTION OF THE DRAWING(S)

An exemplary embodiment of the invention will now be described with reference to the single figure drawing (FIG. 1) which shows a preferred embodiment of a voltage detector circuit in accordance with the invention.

DETAILED DESCRIPTION OF A PREFERRED EMBODIMENT

Figure 1:
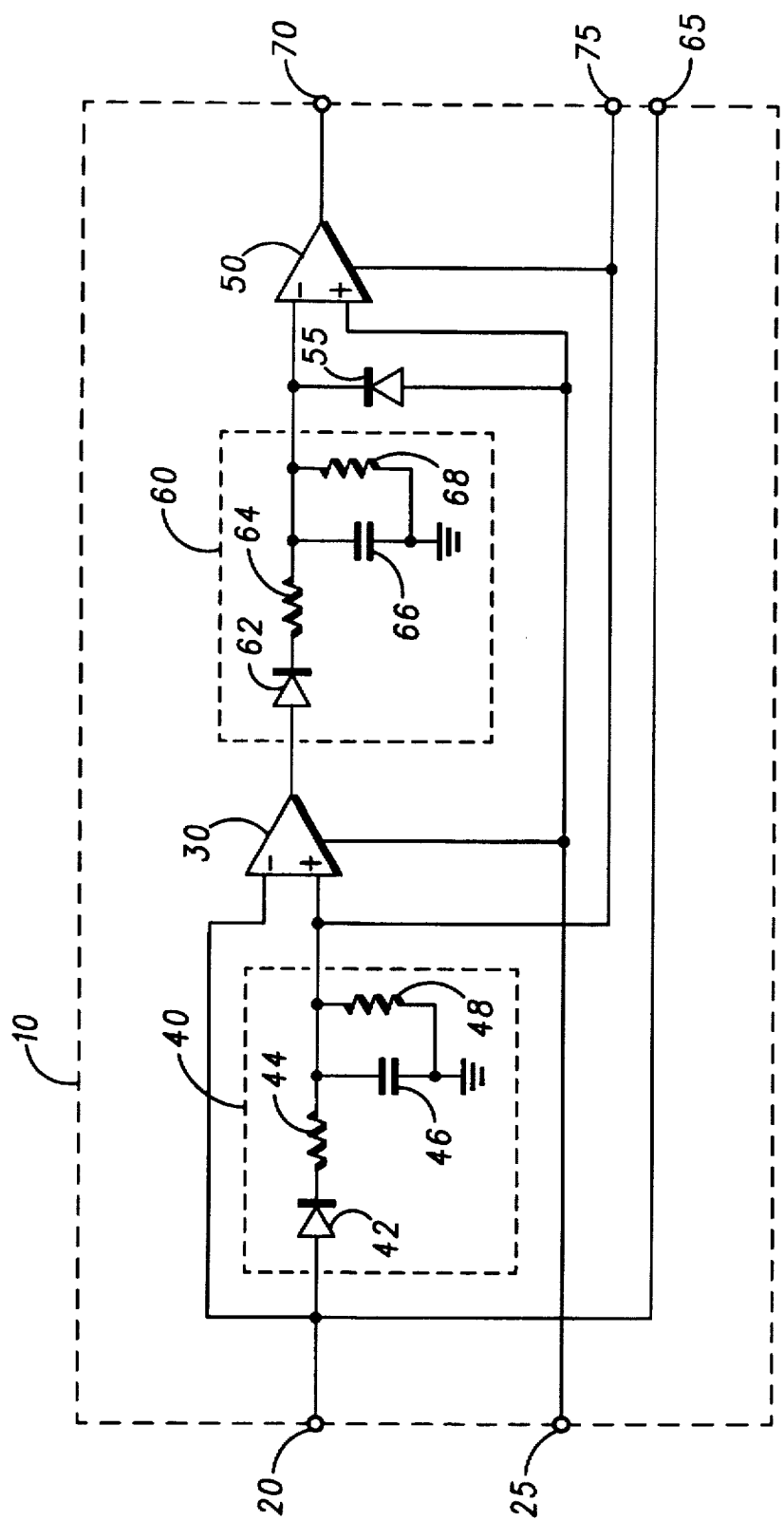

Referring to FIG.1, there is shown a voltage detector circuit 10, comprising a data input terminal 20, a bias voltage input terminal 25, first and second differential amplifiers 30 and 50 respectively, first and second peak detector circuits 40 and 60 respectively, and first, second and third data output terminals 65, 70 and 75 respectively.

The data input terminal 20 is coupled to receive digital data, typically in the form of a demodulated data bitstream. The first data output terminal 65 is coupled to the data input terminal 20, for providing the original data bitstream.

The first differential amplifier 30 comprises an inverting input, a non-inverting input, a bias input and an output. The inverting input is coupled to the input terminal 20, and the bias input is coupled to the voltage bias input terminal 25.

The first peak detector circuit 40 comprises a first diode 42 coupled to the input terminal 20 and biased to receive signals therefrom. A first resistor 44 is coupled between the first diode 42 and the non-inverting input of the first differential amplifier 30. A first capacitor 46 and a second resistor 48 are both coupled between the non-inverting input of the first differential amplifier 30 and ground. The non-inverting input is also coupled to the third data output terminal 75.

The second differential amplifier 50 comprises an inverting input, a non-inverting input, a bias input and an output. The non-inverting input is coupled to the voltage bias input terminal 25, the bias input is coupled to the non-inverting input of the first differential amplifier 30 and the output is coupled to the second data output terminal 70.

The second peak detector circuit 60 comprises a second diode 62 coupled to the output of the first differential amplifier 30 and biased to receive signals therefrom. A third resistor 64 is coupled between the second diode 62 and the non-inverting input of the second differential amplifier 50. A second capacitor 66 and a fourth resistor 68 are both coupled between the inverting input of the second differential amplifier 50 and ground.

A third diode 55 is coupled between the voltage bias input terminal 25 and the inverting input of the second differential amplifier 50 and is biased to allow current to flow from the voltage bias input terminal 25 to the inverting input of the second differential amplifier 50.

In operation, a data bitstream is received at the data input terminal 20 and a bias voltage (Vbias) is received at the voltage bias input terminal 25.

Voltage peaks in the data bitstream are detected by the RC arrangement of first and second resistors 44, 48 and first capacitor 46 in the first voltage detector circuit 40. The voltage peaks have a positive voltage level and correspond to logical 1 values within the bitstream.

The first differential amplifier 30 subtracts the voltage level of the data bitstream from the level of the voltage peaks, with the bias voltage Vbias and unity gain.

Therefore the output V1 of the first differential amplifier 30 is given by:

$$V1 = 1(Vp - Vin) + Vbias \qquad \text{Equation 1}$$

where Vp is the voltage level of logical 1, and Vin is the voltage level of the data bitstream.

The second peak detector 60 then detects peaks in V1, which are equivalent to:

$$(Vp - Vn) + Vbias \qquad \text{Equation 2}$$

where Vn is the lowest value of Vin, corresponding to logical 0.

The second differential amplifier 50 subtracts the value of Equation 2 from Vbias, with a gain of 0.5 and with a bias voltage of Vp.

Therefore the output V2 of the second differential amplifier is given by:

$$\begin{aligned} V2 &= 0.5\{Vbias - [(Vp - Vn) + Vbias]\} + Vp \qquad \text{Equation 3}\\ &= 0.5(Vn - Vp) + Vp \\ &= 0.5(Vn + Vp) \end{aligned}$$

Therefore the output V2 of the second differential amplifier is equal to a voltage exactly halfway between the logical 0 level and the logical 1 level, irrespective of the relative proportions of the occurrence of logical 0 and logical 1 data.

The third diode 55 prevents the inverting input of the second differential amplifier 50 from dropping below the level of Vbias, thereby preventing the second data output 70 exceeding Vp in the absence of data.

It will be appreciated that alternative embodiments to the one described above are possible. For example, the peak detector circuits 40 and 60 could be implemented using discrete components other than the precise arrangement of resistors capacitors and diodes described.

I claim:

1. A voltage detector circuit for detecting voltage levels of a digital data bitstream, the detector circuit comprising:

an input terminal coupled to receive the digital data bitstream;

a first peak detector circuit coupled to the input terminal, for detecting a positive peak voltage thereat, and for providing a first peak signal;

a first differential amplifier coupled to the input terminal and further coupled to receive the first peak signal, for providing a first difference signal; and, a second peak detector circuit coupled to receive the first difference signal from the first differential amplifier, for detecting a peak voltage in the first difference signal and for providing a second peak signal, wherein the first peak signal indicates the value of logical 1 levels in the bitstream, and the second peak signal indicates the relative value of logical 0 levels in the bitstream with respect to the logical 1 levels.

2. The voltage detector circuit of claim 1 further comprising a second differential amplifier coupled to receive the first and second peak signals, for providing a value indicative of the voltage level at a mid-point between the logical 1 and logical 0 levels.

3. The voltage detector circuit of claim 2 wherein a voltage bias signal is used to bias the first differential amplifier.

4. The voltage detector circuit of claim 2 wherein the first peak signal is used to bias the second differential amplifier.

5. The voltage detector circuit of claim 4, wherein the second differential amplifier comprises a non-inverting input coupled to receive the voltage bias signal, and an inverting input coupled to receive the second peak signal.

6. The voltage detector circuit of any of the claim 2 wherein the second differential amplifier has a gain of substantially 0.5.

7. The voltage detector circuit of claim 1 wherein the first differential amplifier has a gain of substantially 1.

* * * * *